US012648243B2

(12) United States Patent
Brown et al.

(10) Patent No.: US 12,648,243 B2
(45) Date of Patent: Jun. 2, 2026

(54) BIASING AND READOUT METHODS FOR HIGH-SPEED RESISTIVE GATE SENSOR

(71) Applicant: KLA Corporation, Milpitas, CA (US)

(72) Inventors: David L. Brown, Los Gatos, CA (US); Jehn-Huar Howard Chern, Morgan Hill, CA (US); Marcel Trimpl, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/809,802

(22) Filed: Aug. 20, 2024

(65) Prior Publication Data

US 2025/0072139 A1 Feb. 27, 2025

Related U.S. Application Data

(60) Provisional application No. 63/534,119, filed on Aug. 23, 2023.

(51) Int. Cl.
  *H10F 39/00* (2025.01)
  *H10F 39/18* (2025.01)
(52) U.S. Cl.
  CPC ..... *H10F 39/80373* (2025.01); *H10F 39/016* (2025.01); *H10F 39/189* (2025.01)
(58) Field of Classification Search
  CPC . H10F 39/80373; H10F 39/016; H10F 39/189
  See application file for complete search history.

(56) References Cited

U.S. PATENT DOCUMENTS

| | | | |
|---|---|---|---|
| 11,610,757 B2 | 3/2023 | Trimpl | |
| 2003/0137025 A1 | 7/2003 | Rhodes | |
| 2006/0060780 A1 | 3/2006 | Masnaghetti et al. | |
| 2011/0073982 A1 | 3/2011 | Armstrong et al. | |

(Continued)

FOREIGN PATENT DOCUMENTS

| | | | | |
|---|---|---|---|---|
| CN | 116314217 A | * | 6/2023 | ............ H10F 39/011 |
| EP | 0116702 A2 | | 8/1984 | |

(Continued)

OTHER PUBLICATIONS

Improved Machine Translation of CN116314217A, published Jun. 23, 2023.*

(Continued)

*Primary Examiner* — Suberr L Chi
(74) *Attorney, Agent, or Firm* — Suiter Swantz IP

(57) ABSTRACT

Photon or electron detectors may include polycrystalline silicon resistive gates with voltage gradients applied to reduce lag and improve operating speeds. The polycrystalline silicon resistive gates may be doped polycrystalline silicon which is heavily doped with donor atoms or acceptor atoms and ion-implanted with an electrically inactive species. The electrically inactive species may be implanted in a pattern to form multiple ion-implanted regions with different resistivities. The ion-implanted regions are formed in select patterns to control the resistivity of the polycrystalline silicon resistive gates and to modify the lateral electric field across the differentially-biased polycrystalline silicon resistive gate. The X-ray detectors may also include a circuit element with a current-mode differential connection to improve clock feedthrough and power dissipation characteristics.

23 Claims, 6 Drawing Sheets

218

218

(56)                    References Cited

U.S. PATENT DOCUMENTS

| | | | |
|---|---|---|---|
| 2013/0176552 A1 | 7/2013 | Brown et al. | |
| 2013/0264481 A1 | 10/2013 | Chern et al. | |
| 2016/0056258 A1 | 2/2016 | Rouh et al. | |
| 2017/0329025 A1 | 11/2017 | Brown et al. | |
| 2017/0338257 A1 | 11/2017 | Muramatsu et al. | |
| 2018/0070040 A1 | 3/2018 | Chuang et al. | |
| 2019/0253652 A1 | 8/2019 | Chuang et al. | |
| 2019/0386054 A1 | 12/2019 | Chuang et al. | |
| 2021/0066035 A1 | 3/2021 | Trimpl | |
| 2021/0167200 A1 | 6/2021 | Radosavljevic et al. | |
| 2022/0399220 A1 | 12/2022 | Gerling et al. | |
| 2023/0118540 A1* | 4/2023 | Jang ........................ | H10F 39/12 |
| | | | 257/292 |

FOREIGN PATENT DOCUMENTS

| | | | |
|---|---|---|---|
| JP | 2007523491 A | 8/2007 | |
| KR | 1020080010815 A | 1/2008 | |

OTHER PUBLICATIONS

Korean Intellectual Property Office, International Search Report and Written Opinion received in International Application No. PCT/US2024/043313, Dec. 4, 2024, 7 pages.

Lechner et al., "Silicon drift detectors for high resolution room temperature X-ray spectroscopy," Nuclear Instruments and Methods, Research A 377, 1996, 6 pages.

Linder, "Application of the Plasma Immersion Ion Implantation Coupled Plasma Model for Energy Spread and Oxide Charging," Dec. 19, 1996, 104 pages.

* cited by examiner

<u>100</u>

122

218

<u>500</u>

510 —— DEPOSITING POLYCRYSTALLINE SILICON FILM

520 —— HEAVILY DOPING POLYCRYSTALLINE SILICON FILM

530 —— ION-IMPLANTING THE HEAVILY DOPED POLYCRYSTALLINE SILICON WITH ELECTRICALLY INACTIVE SPECIES

532 —— MASKING A REGION OF THE POLYCRYSTALLINE SILICON FILM

534 —— ION-IMPLANTING UNMASKED REGION OF THE POLYCRYSTALLINE SILICON FILM

536 —— UNMASKING THE POLYCRYSTALLINE SILICON FILM

540 —— ANNEALING HEAVILY DOPED POLYCRYSTALLINE SILICON TO FORM POLYCRYSTALLINE SILICON RESISTIVE GATE

FIG.5

BIASING AND READOUT METHODS FOR HIGH-SPEED RESISTIVE GATE SENSOR

CROSS REFERENCE TO RELATED APPLICATION

The present application claims the benefit under 35 U.S.C. § 119(e) of U.S. Provisional Application Ser. No. 63/534,119, filed Aug. 23, 2023, titled "HIGH-SPEED BIASING AND READOUT METHODS FOR RESISTIVE GATE SENSOR", which is incorporated herein by reference in the entirety.

TECHNICAL FIELD

The present disclosure generally relates to imaging microscopy, and more particularly to electron and photon detectors for high-speed scanning in electron or optical microscopy applications.

BACKGROUND

Undoped thin films (a few microns or less) of polycrystalline silicon exhibit extremely high sheet resistance, at least as high as $10^8$ to $10^{10}$ ohms per square, because the conduction takes place across grain boundaries. The undoped thin films of polycrystalline silicon are temperature sensitive and highly resistive. Heavily-doped polycrystalline silicon films exhibit relatively low resistivity, and are often used as gates for capacitors and transistors in image sensors. The low resistivity limits effective use of polysilicon for gates with different voltage applied at different locations on the same gate, since the current and resulting power dissipation would be high in some cases. A higher resistivity polysilicon is desired for this purpose. Fabrication of relatively more resistive polycrystalline silicon films can be achieved by employing the use of lightly doped polycrystalline silicon. In the case that a specific resistivity range is desired, tuning of the p- or n-type implant dosage may result in sporadic resistivities. Reproducible sheet resistivities are difficult to obtain in lightly doped polycrystalline silicon. In the lightly doped condition, the resistivity is highly sensitive to both the action of charge carrier traps at grain boundaries and to the grain size, which together have a complex and unpredictable dependence on numerous processing variables (e.g., doping concentration, deposition temperature, contamination, and the like). In addition, the resistivity strongly depends on the doping level (the sheet resistance decreases non-linearly with the doping level). Therefore, it would be advantageous to provide a device, system, and method that cures the shortcomings described above.

SUMMARY

A polycrystalline silicon resistive gate is described, in accordance with one or more embodiments of the present disclosure. The polycrystalline silicon resistive gate may include: heavily doped polycrystalline silicon, wherein the heavily doped polycrystalline silicon is one of an n-type semiconductor or a p-type semiconductor, wherein the heavily doped polycrystalline silicon is heavily doped with a plurality of atoms, wherein the plurality of atoms include one of donor atoms or acceptor atoms, wherein the plurality of atoms saturate a plurality of carrier traps of the heavily doped polycrystalline silicon; wherein the heavily doped polycrystalline silicon is ion-implanted with an electrically inactive species, wherein the electrically inactive species includes one of carbon or nitrogen, wherein the electrically inactive species define a first ion-implanted region and a second ion-implanted region, wherein the first ion-implanted region is implanted with a higher concentration of the electrically inactive species than the second ion-implanted region, wherein a first resistivity of the first ion-implanted region is higher than a second resistivity of the second ion-implanted region.

An X-ray detector is described, in accordance with one or more embodiments of the present disclosure. The X-ray detector may include: a gate oxide layer; and a plurality of polycrystalline silicon resistive gates, wherein the plurality of polycrystalline silicon resistive gates are formed in the gate oxide layer, wherein the plurality of polycrystalline silicon resistive gates include: heavily doped polycrystalline silicon, wherein the heavily doped polycrystalline silicon is one of an n-type semiconductor or a p-type semiconductor, wherein the heavily doped polycrystalline silicon is heavily doped with a plurality of atoms, wherein the plurality of atoms include one of donor atoms or acceptor atoms, wherein the plurality of atoms saturate a plurality of carrier traps of the heavily doped polycrystalline silicon; wherein the heavily doped polycrystalline silicon is ion-implanted with an electrically inactive species, wherein the electrically inactive species includes one of carbon or nitrogen, wherein the electrically inactive species define a first ion-implanted region and a second ion-implanted region, wherein the first ion-implanted region is implanted with a higher concentration of the electrically inactive species than the second ion-implanted region, wherein a first resistivity of the first ion-implanted region is higher than a second resistivity of the second ion-implanted region; wherein the X-ray detector is configured to generate an image data signal in response to detecting at least one X-ray photon.

A scanning electron microscope is described, in accordance with one or more embodiments of the present disclosure. The scanning electron microscope may include: an electron source configured to generate an electron beam; an electron optical system configured to focus the electron beam and scan the electron beam over a sample; and at least one X-ray detector including: a gate oxide layer; and a plurality of polycrystalline silicon resistive gates, wherein the plurality of polycrystalline silicon resistive gates are formed in the gate oxide layer, wherein the plurality of polycrystalline silicon resistive gates include: heavily doped polycrystalline silicon, wherein the heavily doped polycrystalline silicon is one of an n-type semiconductor or a p-type semiconductor, wherein the heavily doped polycrystalline silicon is heavily doped with a plurality of atoms, wherein the plurality of atoms include one of donor atoms or acceptor atoms, wherein the plurality of atoms saturate a plurality of carrier traps of the heavily doped polycrystalline silicon; wherein the heavily doped polycrystalline silicon is ion-implanted with an electrically inactive species, wherein the electrically inactive species includes one of carbon or nitrogen, wherein the electrically inactive species define a first ion-implanted region and a second ion-implanted region, wherein the first ion-implanted region is implanted with a higher concentration of the electrically inactive species than the second ion-implanted region, wherein a first resistivity of the first ion-implanted region is higher than a second resistivity of the second ion-implanted region; wherein the at least one X-ray detector is configured to generate an image data signal in response to detecting at least one X-ray photon generated from the sample resulting from exposure to the electron beam.

A method is described, in accordance with one or more embodiments of the present disclosure. The method may include: depositing a polycrystalline silicon film on a gate oxide layer; heavily doping the polycrystalline silicon film with a plurality of atoms to form a heavily doped polycrystalline silicon, wherein the heavily doped polycrystalline silicon is one of an n-type semiconductor or a p-type semiconductor, wherein the plurality of atoms include one of donor atoms or acceptor atoms, wherein the plurality of atoms saturate a plurality of carrier traps of the heavily doped polycrystalline silicon; ion-implanting the heavily doped polycrystalline silicon with an electrically inactive species, wherein the electrically inactive species includes one of carbon or nitrogen; and annealing the heavily doped polycrystalline silicon after ion-implantation to form a polycrystalline silicon resistive gate, wherein the electrically inactive species define a first ion-implanted region and a second ion-implanted region, wherein the first ion-implanted region is implanted with a higher concentration of the electrically inactive species than the second ion-implanted region, wherein a first resistivity of the first ion-implanted region is higher than a second resistivity of the second ion-implanted region.

BRIEF DESCRIPTION OF THE DRAWINGS

The numerous advantages of the disclosure may be better understood by those skilled in the art by reference to the accompanying figures in which:

FIG. 5 depicts a flow diagram of a method of forming the polycrystalline silicon resistive gate, in accordance with one or more embodiments of the present disclosure.

DETAILED DESCRIPTION

Figure 1:
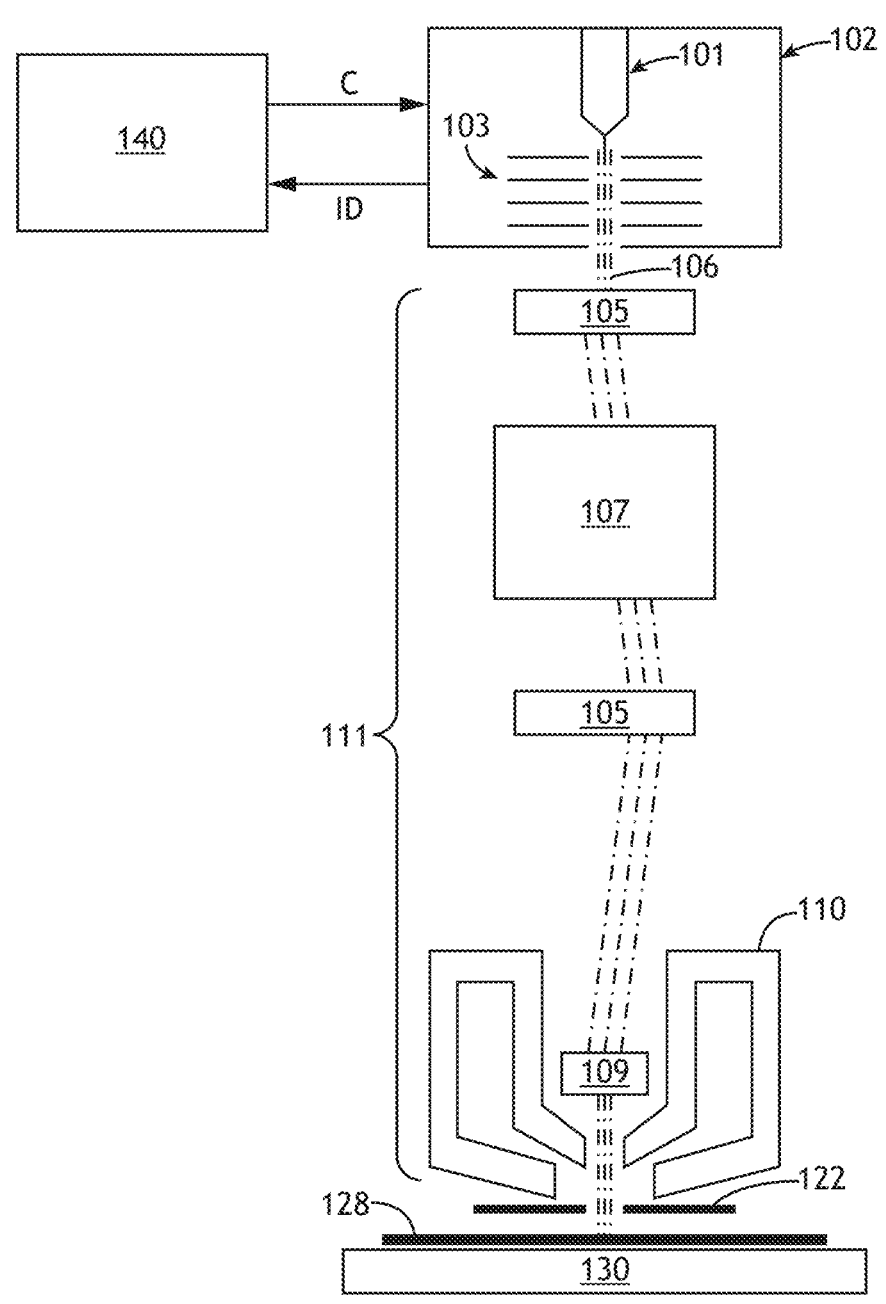
FIG. 1 depicts a scanning electron microscope with X-ray detectors, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed to X-ray detectors of a scanning electron microscope. The X-ray detectors may include polycrystalline silicon resistive gates. The polycrystalline silicon resistive gates may be doped polycrystalline silicon which is heavily doped with donor atoms or acceptor atoms and ion-implanted with an electrically inactive species. The electrically inactive species may be implanted in a pattern to form multiple ion-implanted regions with different resistivities. The ion-implanted regions are formed in select patterns to control the resistivity of the polycrystalline silicon resistive gates and to modify the lateral electric field across the differentially-biased polycrystalline silicon resistive gate. The X-ray detectors may also include a circuit element with a current-mode differential connection to improve clock feedthrough and power dissipation characteristics.

Within regions of a CCD sensor, it is desirable to optimize charge transport for high-speed operation. Multiple gates may be employed that need to be isolated and operated over time with voltage changes to move charge from one location to another. Under a constant-voltage gate, the charge transport is limited by diffusion, which can result in low performance for large gates. For this reason, many small gates are typically used for high-speed operation. A single resistive gate may also be used, with different voltages at boundary or interior locations. This configuration results in lateral electric fields in the bulk of the sensor, which allows efficient charge transport without clock operation. Use of two or more different resistivities within a single polysilicon sheet can overcome the challenges of lag and reduced charge collection efficiency that can occur with devices employing large single polysilicon gates. Fabrication of such gates along with design patterns with performance advantages are described.

For achieving high signal-to-noise ratios within each resolution element of a CCD-like sensor array, careful control of the ground potential and the reset level of the output circuit floating diffusion region is necessary. High-speed operation is typically limited by clock feedthrough and other noise contributions generated on the sensor. A source-follower architecture is often used to provide an analog output voltage proportional to charge collected at the floating diffusion region. A circuit design is provided with reduced sensitivity to these noise sources.

European Patent Number 0116702A2, titled "Method for forming polycrystalline silicon reproducible and controllable resistivity"; U.S. Patent Number 2006/0060780, titled "Apparatus and method for E-beam dark field imaging"; U.S. Patent Publication Number 2011/0073982, titled "Inspection system using back side illuminated linear sensor"; U.S. Patent Publication Number 2013/0264481, titled "Back-illuminated Sensor With Boron Layer"; U.S. Patent Publication Number 2013/0176552, titled "Interposer based imaging sensor for high-speed image acquisition and inspection systems"; U.S. Patent Publication Number 2017/0338257, titled "Anti-Reflection Layer For Back-Illuminated Sensor"; U.S. Patent Publication Number 2017/0329025, titled "Scanning Electron Microscope And Methods Of Inspecting And Reviewing Samples"; U.S. Patent Publication Number 2018/0070040, titled "Sensor with electrically controllable aperture for inspection and metrology systems"; U.S. Patent Publication Number 2019/0253652, titled "Dual-Column-Parallel CCD Sensor And Inspection Systems Using A Sensor"; U.S. Patent Publication Number 2019/0386054, titled "Back-Illuminated Sensor And A Method Of Manufacturing A Sensor"; U.S. Patent Publication Number 2021/0066035, titled "Sensor module for scanning electron microscopy applications"; U.S. Patent Publication Number 2022/0399220, titled "Segmented multi-channel, backside illuminated, solid state detector with a through-hole for detecting secondary and backscattered electrons"; are each incorporated herein by reference in the entirety.

FIG. 1 depicts a scanning electron microscope 100 (SEM), in accordance with one or more embodiments of the present disclosure. The scanning electron microscope 100 may be an inspection or review system configured to inspect or review a sample 128. The scanning electron microscope 100 may review and/or inspect the sample 128 for defects and to reveal the material composition of the sample 128 and/or defects. The scanning electron microscope 100 may include an electron source 102, an electron optical system 111, a stage 130, and/or a controller 140.

The electron source 102 may be a source of electrons. The electron source 102 may include any electron source suitable for generating an electron beam 106. The electron source 102 may also be referred to as an electron gun. The electron beam 106 may also be referred to as a primary electron beam. The electron beam 106 may include a beam energy and a beam current.

The electron source 102 may include electron emitters 101, extractors 103, a magnetic lens (not depicted), and the like.

The electron source 102 may include any number of the electron emitters 101. For example, the electron source 102 may include a single of the electron emitters 101. By way of another example, the electron source 102 may include multiple of the electron emitters 101.

The electron emitters 101 may be a cathode. For example, the cathode may include a thermal field-emitting or Schottky cathode, a single-crystal tungsten cathode, a LaB6 cathode, or the like.

The extractors 103 may be electrodes. The extractors 103 may be arranged in the path of the electron beam 106.

The electron optical system 111 may include a set of electron optics arranged in an electron-optical column. The electron optical system 111 may include one or more focusing optics and/or deflecting optics.

The focusing optics may focus the electron beam 106 onto the sample 128. The electron optical system 111 may include any focusing optics. For example, the one or more focusing optics may include, but are not limited to, condenser lens 107 and objective lens 110.

The condenser lens 107 may de-magnify the electron beam 106 to create a small spot on the sample 128. Spot sizes of about one or a few nm may generate high-resolution images for review of the sample 128. Inspection of the sample 128 may use larger spot sizes to scan the sample 128 more quickly. The electron optical system 111 may include any number of the condenser lens 107. A single of the condenser lens 107 may suffice when the spot size is of order of one-hundred nm or larger, but two or more of the condenser lens 107 may be needed for spot sizes of tens of nm or smaller. The condenser lens 107 may include a magnetic lens, an electrostatic lens, both a magnetic lens and an electrostatic lens, or the like.

The objective lens 110 may be a final lens within the electron optical system 111 before the electron beam 106 reaches the sample 128. The objective lens 110 may focus the electron beam 106 to a small spot on the sample 128. The objective lens 110 may include a magnetic lens, an electrostatic lens, a combination of a magnetic lens and an electrostatic lens, or the like. The objective lens 110 may be an immersion lens. To achieve a small spot size at the sample 128, the objective lens 110 may be placed close to the sample 128, so that the sample 128 is immersed in the magnetic field of the objective lens 110. Immersing the sample in the magnetic field may reduce aberrations in the electron spot on the sample 128.

The deflection optics may be configured to scan the electron beam 106 over the sample 128. The electron optical system 111 may include any deflection optics. The one or more deflection optics may include, but are not limited to, one or more deflectors (e.g., scanning coils). For example, the electron optical system 111 may include deflectors 105 and deflectors 109.

The deflectors 105 may scan the electron beam 106 over an area of the sample 128. The deflectors 105 may be placed on either side of condenser lens 107 as shown, or within the condenser lens 107 (not shown), or after the condenser lens 107. The deflectors 105 may include electrostatic deflectors or a combination of magnetic and electrostatic deflectors.

The deflectors 109 may work in combination with deflectors 105 to scan the electron beam 106 over an area of the sample 128.

The electron beam 106 may be focused and deflected by the deflectors 105, the condenser lens 107, the deflectors 109, and the objective lens 110 onto the sample 128 positioned on the stage 130. The electron source 102 and electron optical system 111 may be arranged in a single-beam configuration or in a multi-beam configuration. For example, the electron source 102 may generate a single of the electron beam 106 that is deflected and focused onto the sample 128. By way of another example, the electron source 102 may also generate multiple of the electron beams 106 that are deflected and focused onto the sample 128. As depicted, the electron source 102 and electron optical system 111 are depicted in the single-beam configuration, although this is not intended to be limiting.

The sample 128 may include sample types typically reviewed by the scanning electron microscope 100. For example, the sample 128 may include an un-patterned semiconductor wafer, a patterned semiconductor wafer, a reticle, a photomask, or the like.

The stage 130 may support and position the sample 128. The sample 128 may be placed on the stage 130. The stage 130 may facilitate movement of different regions of sample 128 underneath the electron optical system 111. The stage 130 may include an X-Y stage or an R-θ stage. The stage 130 may adjust the height of sample 128 during inspection to maintain focus.

The electron optical system 111 may also include a focus sensor (not shown). The focus sensor may be an optical sensor. The focus sensor may also be referred to as a height sensor. The focus sensor may be mounted on or proximate to objective lens 110. The focus sensor may provide a signal to adjust the height of sample 128 or to adjust the focus of the objective lens 110.

The X-ray detectors 122 may not block the electron beam 106 on the way to the sample 128. X-ray photons may be emitted from an area of the sample 128 when the electron beam 106 is scanned by the electron optical system 111 over the area. The X-ray photons may be generated from the sample 128 resulting from exposure to the electron beam 106. The X-ray photons may be detected by the X-ray detectors 122 that is in direct line-of sight to the region of the sample 128 being exposed to the electron beam 106.

The X-ray detectors 122 may be positioned at one or more selected locations in view of the sample 128. The scanning electron microscope 100 may include any number of the X-ray detectors 122.

The X-ray detectors 122 may include an application specific integrated circuit. The application specific integrated circuit may be used to digitize and preprocess the X-ray signals collected by the X-ray detectors 122.

The X-ray detectors 122 may collect X-rays photons and/or auger electrons emanating from the sample 128 (e.g., emanating from the sample at a very high solid angle).

The X-ray detectors 122 may be adjacent to the sample 128. For example, the X-ray detectors 122 may be placed between the objective lens 110 and the sample 128. The gap between the sample 128 and the objective lens 110 may be small, such as about 2 mm or less, and clearance may be needed, for example, for a focus or height sensor, and so it may not be practical to place the X-ray detectors 122 between the objective lens 110 and the sample 128.

The electron emitters 101 and the sample 128 may include a potential difference. The landing energy of the electron beam 106 on the sample 128 may depend on the potential difference between the electron emitters 101 and the sample 128. The landing energy may be adjusted by changing the potential of the electron emitters 101. Alternatively, the landing energy on the sample 128 may be adjusted by changing the potential of the stage 130 and sample 128 relative to ground. The landing energy on the sample 128 may be adjusted to allow X-rays with the energy range of interest to be generated from different sample materials. For example, the landing energy on the sample 128 may be between about 1 keV and 6 keV.

The X-ray detectors 122 may include a select sensitivity. The sensitivity may also be referred to as gain. The sensitivity may be the number of the electron-hole pairs formed from incident X-ray photons. The gain of the X-ray detectors 122 may allow the energy of the X-ray photons to be estimated by measuring the number of electrons detected for each X-ray detection. Each X-ray photon may generate multiple signal electrons in the X-ray detectors 122, allowing the X-ray detectors 122 to measure the X-ray energy.

The X-ray detectors 122 may convert X-rays into measurable charges entirely within the structure of the X-ray detectors 122.

The X-ray detectors 122 may be a solid-state X-ray detector. For example, the detecting medium of the X-ray detectors 122 may be silicon (e.g., a p-n junction). The X-ray detectors 122 may each include one or more solid-state sensors. For example, the X-ray detectors 122 may each include one or more multipixel solid-state sensors. An entire incident X-ray-to-readout conversion may take place entirely within the X-ray detectors 122.

The X-ray detectors 122 may be configured to generate image data signals in response to detecting one or more X-ray photons. The X-ray detectors 122 may be configured to generate image data signal ID in response to detecting emitted X-ray photons. The X-ray image data signal ID may be transferred to controller 140 from the X-ray detectors 122.

The controller 140 may utilize the X-ray detectors 122 to generate images of the scanned area of the sample 128. For example, the controller 140 may utilize the X-ray image data signal ID to generate an image of the associated scanned sample area, whereby visual inspection of a defect including an unknown material is facilitated.

The controller 140 may also be configured to perform additional functions, such as determining the presence of a defect and/or the type of the defect based on incident X-ray energy values indicated by the image data signals. For example, the controller 140 may use the X-ray image data signal ID to determine the presence of the defect in the scanned area. The defect may include the presence of material (such as a particle) that is not supposed to be present in the scanned area, the absence of material that is supposed to be in the scanned area (such as may happen with an over-etched condition), or a malformed pattern. The controller 140 may also determine the defect type and/or material type of the defect.

The X-ray detectors 122 may include a select sensitivity for generating many electron-hole pairs from a single X-ray photon. The X-ray detectors 122 may include various improvements to improve the sensitivity, such as, but not limited to, polycrystalline silicon resistive gates which are patterned with a profile and/or a differential amplifier, as will be described further herein.

Figure 2:
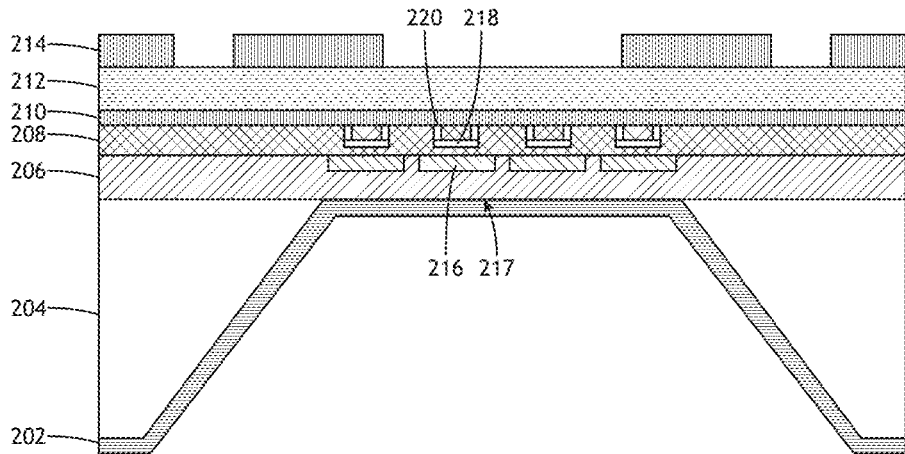
FIG. 2 depicts a simplified cross-section view of the X-ray detectors with polycrystalline silicon resistive gates, in accordance with one or more embodiments of the present disclosure.

FIG. 2 depicts the X-ray detector 122, in accordance with one or more embodiments of the present disclosure. The X-ray detector 122 may be a charge-coupled device (CCD). The X-ray detector 122 may include a boron layer 202, a substrate 204, an epitaxial layer 206, a gate oxide layer 208, a silicon nitride gate layer 210, circuit elements 212, a front side metal 214, a buried channel layer 216, polycrystalline silicon resistive gates 218, electrical connections 220, and the like.

The epitaxial layer 206 may be formed on the front side of the substrate 204. The epitaxial layer 206 may be disposed between the substrate 204 and the gate oxide layer 208. The epitaxial layer 206 may include a select thickness. For example, the epitaxial layer 206 may include a thickness of between 20 and 50 μm. The epitaxial layer 206 may be epitaxial silicon or the like.

The substrate 204 and/or the epitaxial layer 206 may be p-type semiconductors. The substrate 204 and/or the epitaxial layer 206 may be doped with any suitable acceptor atoms, such as, but not limited to boron, aluminum, gallium, or the like. The substrate 204 and/or the epitaxial layer 206 may include select concentrations of the acceptor atoms. The substrate 204 may be a p+ (i.e. highly p doped) substrate. For example, the substrate 204 may be a layer with a higher concentration of p dopant than the epitaxial layer 206. The epitaxial layer 206 may be a p– epitaxial layer. For example, the epitaxial layer 206 may be a layer with a lower concentration of p dopant than the substrate 204.

The gate oxide layer 208 may be formed on the epitaxial layer 206. The gate oxide layer 208 may be disposed between the epitaxial layer 206 and the silicon nitride gate layer 210. The gate oxide layer 208 may include silicon dioxide or the like.

The silicon nitride gate layer 210 may be formed on the gate oxide layer 208. The silicon nitride gate layer 210 may be disposed between the gate oxide layer 208 and the circuit elements 212. The silicon nitride gate layer 210 may include silicon nitride.

The silicon nitride gate layer 210 and the gate oxide layer 208 may form a gate dielectric layer. Although the X-ray detector 122 is depicted with one of the silicon nitride gate layer 210 and one of the gate oxide layer 208, this is not intended as a limitation of the present disclosure. The X-ray detector 122 may include a multi-layer gate dielectric layer formed from repeating layers of the silicon nitride gate layer 210 and the gate oxide layer 208. Depending on the type of image sensor technology, the gate dielectric layer may include one, two, or three layers.

The circuit elements 212 may be formed on the silicon nitride gate layer 210. The circuit elements 212 may be disposed between the silicon nitride gate layer 210 and the front side metal 214. Portions of the circuit elements 212 may also extend through the epitaxial layer 206, the gate oxide layer 208, and/or the silicon nitride gate layer 210. For example, portions of the circuit elements 212 may couple to the epitaxial layer 206, the gate oxide layer 208, the buried channel layer 216, the polycrystalline silicon resistive gate 218, the electrical connections 220, and the like.

The circuit elements 212 may include any one or more circuitry elements suitable for driving, receiving, processing, conditioning, controlling, and/or transmitting signals in the X-ray detector 122. The circuit elements 212 may include one or more active circuit elements and/or passive elements, such as, but not limited to, transistors, diodes, resistors, capacitors, inductors, or the like. The circuit elements 212 may include a sensor circuit, a signal processing circuit, a readout circuit, a timing circuit, a driver circuit, an amplification circuit, a conversion circuit, or the like. The readout circuit may readout signals from the pixels 217. The conversion circuit may include an analog-to-digital converter to convert an output signal to a digital form for transmission as X-ray image data signal ID to the controller 140. The various circuits are described in a simplified form for brevity, and it is understood that these circuits may include additional features and perform additional functions.

The front side metal 214 may be formed on the front side of the circuit elements 212. The front side metal 214 may be a metal interconnect. The metal interconnect may include a select metal, such as, but not limited to, aluminum or copper.

The buried channel layer 216 may be formed in the epitaxial layer 206. The top sides of the epitaxial layer 206 and the buried channel layer 216 may coincide. The buried channel layer 216 may abut the gate oxide layer 208. The buried channel layer 216 may be an n-type semiconductor. The buried channel layer 216 may be doped with any suitable donor atom, such as, but not limited to, phosphorous, arsenic, or the like.

The X-ray photons may pass through the boron layer 202 to the epitaxial layer 206. The epitaxial layer 206 may be a photoactive region of the X-ray detectors 122. The epitaxial layer 206 may be configured to generate multiple electron-hole pairs in response to receiving the X-ray photons. In this regard, the sensitivity of the epitaxial layer 206 may be relatively high. The buried channel layer 216 may collect the electrons generated by the epitaxial layer 206. The electrons may be collected and read out as the X-ray image data signal ID.

The X-ray detector 122 may define pixels 217. For example, the epitaxial layer 206 and the buried channel layer 216 may define the pixels 217. The pixels 217 may be arranged in one-dimensional array or a two-dimensional array.

The one-dimensional array may include rows of the pixels 217. The two-dimensional array may include rows and columns of the pixels 217. The buried channel layer 216 may be segmented into the rows and/or columns. The columns may be orthogonal to the rows. The X-ray detector 122 may define any number of the pixels 217 in the rows and/or the columns (e.g., tens, hundreds, or thousands of the pixels 217 in the rows and/or the columns). The rows may or may not include a matching number of the pixels 217 as the columns.

The polycrystalline silicon resistive gates 218 may be formed in the gate oxide layer 208. The polycrystalline silicon resistive gates 218 may be separated from the epitaxial layer 206 and/or the buried channel layer 216 by the gate oxide layer 208. Each of the pixels 217 may include one or more of the polycrystalline silicon resistive gates 218.

Electrical connections 220 may be made to the polycrystalline silicon resistive gates 218. The electrical connections 220 may also be referred to as bias connections. The electrical connections 220 may be made to one or more locations on the polycrystalline silicon resistive gates 218. The electrical connections 220 may bias the polycrystalline silicon resistive gates 218 with voltages. Voltage gradients may be created in the polycrystalline silicon resistive gates 218 by applying voltages to the electrical connections 220. The polycrystalline silicon resistive gates 218 may conduct charge carriers and provide a continuous voltage potential between the electrical connections 220.

The potential at the surface of the epitaxial layer 206 may vary with location according to the voltage at the corresponding location on the polycrystalline silicon resistive gates 218. The varying potential creates an electric field in the epitaxial layer 206 that controls where the photoelectrons collect. Because the epitaxial layer 206 is lightly doped, there are few free carriers and the electric fields from charges near the surface will extend throughout all, or almost all, of the epitaxial layer 206.

The buried channel layer 216 may be configured to transfer the charge carriers generated in the electron-hole pairs to a floating diffusion (not depicted). The floating diffusion may be disposed in the buried channel layer 216 to facilitate receiving the charge carriers. The circuit elements 212 may generate an output signal OS according to a charge (voltage) collected on the floating diffusion. The measured charge (voltage) may be made proportional to the number of charge carriers captured by the floating diffusion.

Figure 3A:
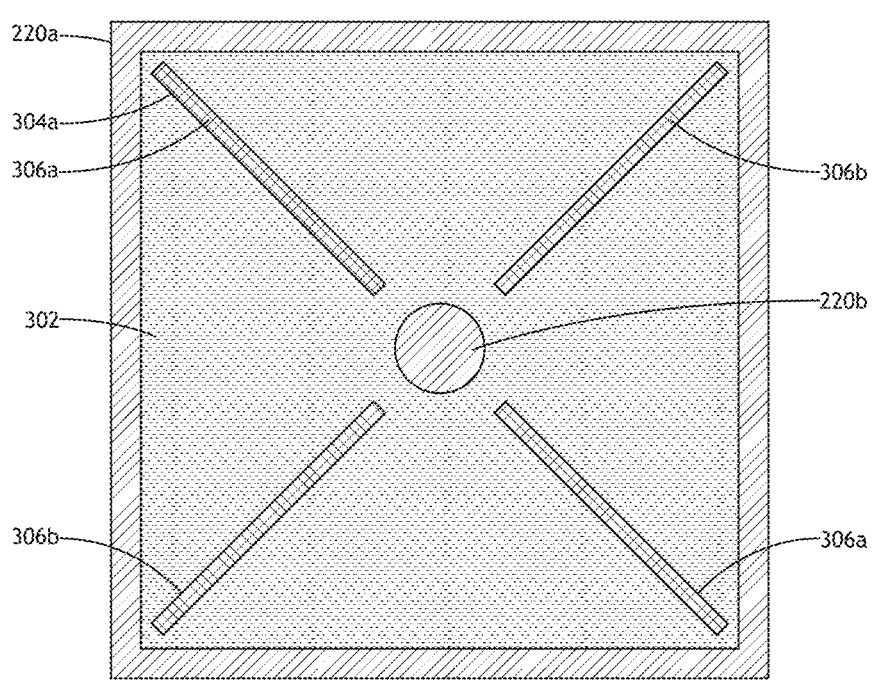
FIGS. 3A-3B depict the polycrystalline silicon resistive gate with multiple ion-implanted regions, in accordance with one or more embodiments of the present disclosure.
Figure 3B:
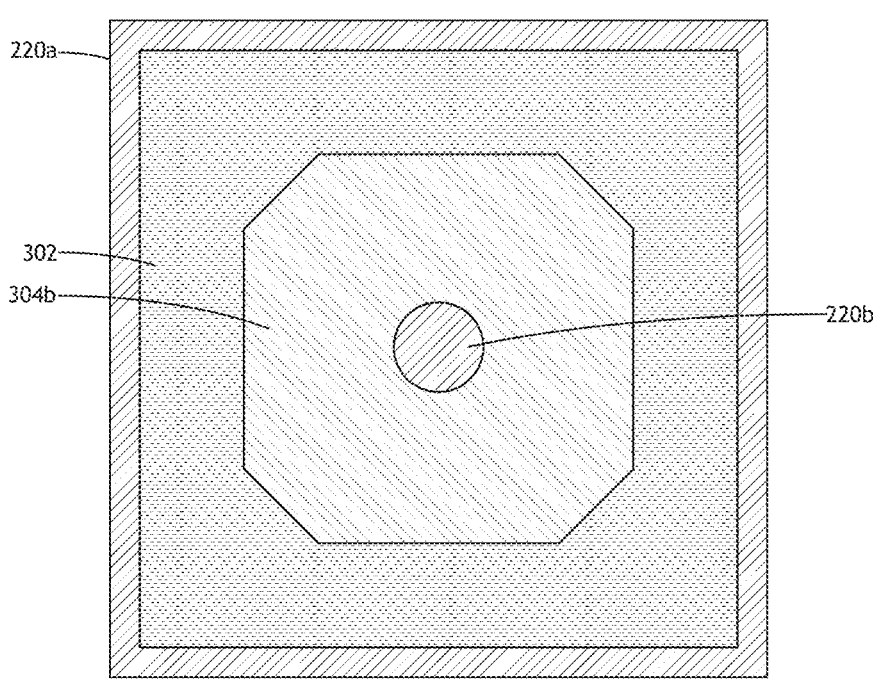

FIGS. 3A-3B depict the polycrystalline silicon resistive gate 218, in accordance with one or more embodiments of the present disclosure.

The polycrystalline silicon resistive gate 218 may be a thin film. The polycrystalline silicon resistive gate 218 may be planar and include a select thickness. For example, the polycrystalline silicon resistive gate 218 may include a thickness of between 50 and 1000 nm. For instance, the polycrystalline silicon resistive gate 218 may include a thickness of about 300 nm.

The polycrystalline silicon resistive gate 218 may be a select shape, such as, a rectangular shape. For example, the polycrystalline silicon resistive gate 218 may be a square shape. The polycrystalline silicon resistive gate 218 may include an aspect ratio. The aspect ratio may be defined by the shape of the polycrystalline silicon resistive gate 218.

The polycrystalline silicon resistive gate 218 may be for a large-pixel. For example, the polycrystalline silicon resistive gate 218 may include a width and/or length on the between 100 and 1000 μm. For instance, the polycrystalline silicon resistive gate 218 may be about 250 μm.

The electrical connections 220 may be made around the perimeter and/or the center of the polycrystalline silicon resistive gate 218. For example, the electrical connections 220 may include a source electrical connection 220a and a drain electrical connection 220b. The source electrical connection 220a and the drain electrical connection 220b may be made around the perimeter of and to the center of, respectively, the polycrystalline silicon resistive gate 218. The polycrystalline silicon resistive gate 218 may experience a voltage drop from the source electrical connection 220a to the drain electrical connection 220b. The source electrical connection 220a and the drain electrical connection 220b may be biased with a select voltage. For example, the source electrical connection 220a and the drain electrical connection 220b may be biased with 5V and 0V, respectively. The source electrical connection 220a and the drain electrical connection 220b may generate an electric field. The electric field may sweep the charge carriers to the drain electrical connection 220b. The charge carriers may be stored near the drain electrical connection 220b and/or collected into a readout circuit.

The polycrystalline silicon resistive gate 218 may include heavily doped polycrystalline silicon. The heavily doped polycrystalline silicon may be an n-type semiconductor or a p-type semiconductor. The heavily doped polycrystalline silicon may be heavily doped with atoms (e.g., donor atoms or acceptor atoms). For example, the heavily doped polycrystalline silicon may be heavily doped phosphorous.

The atoms may saturate the carrier traps of the heavily doped polycrystalline silicon. The heavily doped polycrystalline silicon may be heavily doped with a select concentration of the atoms (e.g., the donor atoms or the acceptor atoms). For example, the heavily doped polycrystalline silicon may be doped with between 30 and 200 times the amount necessary to saturate the carrier traps of the polycrystalline silicon. In others words, the heavily doped polycrystalline silicon may be doped with between 30 and 200 times the ratio of the grain boundary trapping state density to the grain size. The concentration of the atoms at which the polycrystalline silicon resistive gate 218 is doped may be between $1\times10^{19}$ and $6\times10^{19}$ at/cm^3. Particularly for phosphorus, the concentration may be between $1.6\times10^{19}$ and $6\times10^{19}$ at/cm^3.

The doped polycrystalline silicon may be ion-implanted with an electrically inactive species. The electrically inactive species may not contribute electrically to the polycrystalline silicon resistive gate 218. The electrically inactive species may also provide no charge carrier depletion within the polycrystalline silicon resistive gate 218. The electrically inactive species may include carbon or nitrogen atoms. The concentration of the electrically inactive species at which the doped polycrystalline silicon is implanted may be between $3\times10^{19}$ and $3\times10^{21}$ at/cm^3.

The polycrystalline silicon resistive gate 218 may include a select resistivity. For example, the resistivity of the polycrystalline silicon resistive gate 218 may be between 1 and $10^{4}$ ohm-cm. The concentration of the electrically inactive species may control the resistivity of the polycrystalline silicon resistive gate 218. The resistivity of the polycrystalline silicon resistive gate 218 may increase with an increase in the concentration of the electrically inactive species.

The resistivity of the polycrystalline silicon resistive gate 218 may be non-uniform along the polycrystalline silicon resistive gate 218. For example, the resistivity of the polycrystalline silicon resistive gate 218 may be non-uniform along the polycrystalline silicon resistive gate 218 by changing the concentration of the electrically inactive species which are implanted along the polycrystalline silicon resistive gate 218 into multiple ion-implanted regions. The ion-implanted regions may define a spatial profile of the resistivity of the polycrystalline silicon resistive gate 218.

The polycrystalline silicon resistive gate 218 may include ion-implanted region 302 and/or ion-implanted region 304. The electrically inactive species may define the ion-implanted region 302 and/or ion-implanted region 304. The ion-implanted region 302 and the ion-implanted region 304 may be referred to as first ion-implanted regions and second ion-implanted regions, respectively. The ion-implanted region 302 and/or ion-implanted region 304 may be implanted with the electrically inactive species. The ion-implanted region 302 may be implanted with a higher concentration of the electrically inactive species than the ion-implanted region 304. The concentration of the electrically inactive species in the ion-implanted region 302 and/or the ion-implanted region 304 may control the resistivity of the ion-implanted region 302 and/or the ion-implanted region 304.

The ion-implanted region 302 may include a resistivity which is higher than the ion-implanted region 304. In this regard, the ion-implanted region 302 may be referred to as a high resistivity region and the ion-implanted region 304 may be referred to as a low resistivity region. For example, the resistivity of the ion-implanted region 302 may be between four and ten times higher than the resistivity of the ion-implanted region 304.

The polycrystalline silicon resistive gate 218 may be a dual-resistivity resistive gate with the ion-implanted region 302 and the ion-implanted region 304, where the polycrystalline silicon resistive gate 218 includes only two ion-implanted regions. Although the polycrystalline silicon resistive gate 218 is described as a dual-resistivity resistive gate, this is not intended as a limitation of the present disclosure. It is further contemplated that the polycrystalline silicon resistive gate 218 may be a multi-resistivity resistive gate with three or more ion-implanted regions (not depicted) with different resistivities. The polycrystalline silicon resistive gate 218 may include three or more ion-implanted regions, with one or more ion-implanted regions in addition to the ion-implanted region 302 and ion-implanted region 304. The three or more ion-implanted regions may include different concentrations of the electrically inactive species and/or resistivities.

Without the ion-implanted region 302 and/or the ion-implanted region 304, the voltage profile of the polycrystalline silicon resistive gate 218 may be a 2D distribution and is typically not linear. The polycrystalline silicon resistive gate 218 may form gradients to control the lateral fields. The voltage profile may become steeper near the center and results in larger lateral electric field. Near the edge, the voltage profile is less steep, and the resulting lateral electric field is weaker, resulting in slower pixel operation as the size of the polycrystalline silicon resistive gate 218 is increased. The corners of the polycrystalline silicon resistive gate 218 may have significantly weaker fields and may result in slower charge collection time and slower response time of the pixel 127. The uncollected charge is collected on the next readout cycle, resulting in image blur, and is commonly known as image lag.

The ion-implanted region 302 and/or the ion-implanted region 304 may improve the voltage profile of the polycrystalline silicon resistive gate 218. Controlling the resistivity of the polycrystalline silicon resistive gate 218 may allow for optimization of the charge collection and fine control of the electric field distribution. An electric field of the polycrystalline silicon resistive gate 218 may be tailored using the ion-implanted region 302 and/or the ion-implanted region 304 to reduce the worst-case field conditions and to improve a speed of the pixels 217. The ion-implanted region 302 and/or the ion-implanted region 304 may improve the performance of the X-ray detectors 122. For example, the ion-implanted region 302 and/or the ion-implanted region 304 may improve the charge collection efficiency and lag of the X-ray detectors 122. Thus, the ion-implanted region 302 and/or the ion-implanted region 304 may allow for high-speed operation of a sensor using a polycrystalline silicon resistive gate 218.

The ion-implanted region 302 and/or the ion-implanted region 304 may or may not be continuous. For example, the ion-implanted region 302 and/or the ion-implanted region 304 may include portions which are separated from additional portions by the other of the ion-implanted region 302 and/or the ion-implanted region 304.

Specific patterns are described that increase the lateral electric field near the outer edge for the polycrystalline silicon resistive gate 218 using the ion-implanted region 302 and/or the ion-implanted region 304, as compared to uniform implantation.

As depicted in FIG. 3A, the ion-implanted region 304 may be a diagonal-striped ion-implanted region 304a. The remainder of the polycrystalline silicon resistive gate 218 which is not the diagonal-striped ion-implanted region 304a may be the ion-implanted region 302.

The diagonal-striped ion-implanted region 304a may include a pair of diagonal stripes 306a and a pair of the diagonal stripes 306b. The pair of diagonal stripes 306a and the pair of the diagonal stripes 306b may be referred to as a first pair of diagonal stripes and a second pair of diagonal stripes.

The pair of diagonal stripes 306a may be colinear. The pair of the diagonal stripes 306b may also be colinear. The pair of the diagonal stripes 306b may be orthogonal to the pair of diagonal stripes 306a.

The pair of diagonal stripes 306a and the pair of the diagonal stripes 306b may be aligned to the center of the polycrystalline silicon resistive gate 218. The pair of diagonal stripes 306a and the pair of the diagonal stripes 306b may also be aligned to the corners of the polycrystalline silicon resistive gate 218. The pair of diagonal stripes 306a may be aligned to first and third corners of the polycrystalline silicon resistive gate 218. The pair of diagonal stripes 306b may be aligned to second and third corners of the polycrystalline silicon resistive gate 218.

The pair of diagonal stripes 306a and the pair of the diagonal stripes 306b may include a select width. The width of the pair of diagonal stripes 306a and the pair of the diagonal stripes 306b may or may not be the same. As depicted, the width of the pair of diagonal stripes 306a and the pair of the diagonal stripes 306b is the same. The width of the pair of diagonal stripes 306a and the pair of the diagonal stripes 306b may or may not change along the length of the pair of diagonal stripes 306a and the pair of the diagonal stripes 306b. As depicted, the width of the pair of diagonal stripes 306a and the pair of the diagonal stripes 306b does not change along the length of the pair of diagonal stripes 306a and the pair of the diagonal stripes 306b.

The pair of diagonal stripes 306a and/or the pair of the diagonal stripes 306b may include a selected length. The length of the pair of diagonal stripes 306a and/or the pair of the diagonal stripes 306b may be sufficiently small such that the pair of diagonal stripes 306a and/or the pair of the diagonal stripes 306b do not intersect with the pair of diagonal stripes 306a, the pair of the diagonal stripes 306b, the source electrical connection 220a, and/or the drain electrical connection 220b. In this regard, the diagonal-striped ion-implanted region 304a may form an X-shape with a center intersection removed. The ion-implanted region 302 may be disposed between and couple the pair of diagonal stripes 306a, the pair of the diagonal stripes 306b, the source electrical connection 220a, and/or the drain electrical connection 220b.

The pair of diagonal stripes 306a and/or the pair of the diagonal stripes 306b may include a same resistivity. The pair of diagonal stripes 306a and/or the pair of the diagonal stripes 306b may include a resistivity which is less than the ion-implanted region 302. With the diagonal-striped ion-implanted region 304a, the voltage profile of the polycrystalline silicon resistive gate 218 may be improved near the corners of the polycrystalline silicon resistive gate 218. For example, the decrease in resistivity provided by the diagonal-striped ion-implanted region 304a may reduce the voltage drop in the corners of the polycrystalline silicon resistive gate 218.

As depicted in FIG. 3B, the ion-implanted region 304 may be a polygonal-shaped ion-implanted region 304b. The remainder of the polycrystalline silicon resistive gate 218 which is not the polygonal-shaped ion-implanted region 304b may be the ion-implanted region 302.

The difference in voltage applied between the source electrical connection 220a and the drain electrical connection 220b results in a voltage gradient in the polycrystalline silicon resistive gate 218 and a lateral electric field under the polycrystalline silicon resistive gate 218 and within the depleted bulk of the X-ray detector 122. The source electrical connection 220a and the drain electrical connection 220b carry identical average current due to Kirchhoff's junction law, which states that the current into a circuit node must equal the current going out of the circuit node. The source electrical connection 220a has a much larger perimeter compared to the drain electrical connection 220b, which allows for many more electrical contacts to handle the current required to bias the ion-implanted region 302 and the ion-implanted region 304. Also, the current in the polycrystalline silicon resistive gate 218 near the drain electrical connection 220b has a much higher current density than the outer regions, resulting in relatively high local heat generation. The resistivity level of the ion-implanted region 302 with ion-implantation of electrically inactive species may be further tuned so that the total current may be reduced, reducing the power dissipation near the drain electrical connection 220b to acceptable levels. The doping ratio of the ion-implanted region 302 and the ion-implanted region 304 may be adjusted to retain previously described benefits.

The polygonal-shaped ion-implanted region 304b may be centered on the polycrystalline silicon resistive gate 218. For example, a centroid of the polygonal-shaped ion-implanted region 304b may be centered on the polycrystalline silicon resistive gate 218. The drain electrical connection 220b may also be centered on the polygonal-shaped ion-implanted region 304b and/or the polycrystalline silicon resistive gate 218. The ion-implanted region 302 may be disposed between and couple the source electrical connection 220a and the polygonal-shaped ion-implanted region 304b.

The polygonal-shaped ion-implanted region 304b may include any n-agonal shape, where n is an integer. For example, the polygonal-shaped ion-implanted region 304b may be a triangle, a quadrilateral (e.g., a rectangle, trapezoid, parallelogram, rhombus, or the like), a pentagon, a hexagon, a heptagon, an octagon, or the like. As depicted, the polygonal-shaped ion-implanted region 304b may be an octagon, although this is not intended to be limiting.

The polygonal-shaped ion-implanted region 304b may or may not be a regular polygon. The polygonal-shaped ion-implanted region 304b may include reflective symmetry and/or rotational symmetry. As depicted, the polygonal-shaped ion-implanted region 304b is the octagon which is not regular, which includes a reflective symmetry about four axes which are each offset by 45° and are each orthogonal to the center axis of the polygonal-shaped ion-implanted region 304b, and which includes a rotational symmetry of 90°. The center axis of the polygonal-shaped ion-implanted region 304b may be coincident to the center and aligned through the thickness. In this example, the lengths of the sides of the octagon alternate between long sides and short sides. Pairs of the long sides may be parallel to each other. Similarly, pairs of the short sides may be parallel to each.

Figure 4:
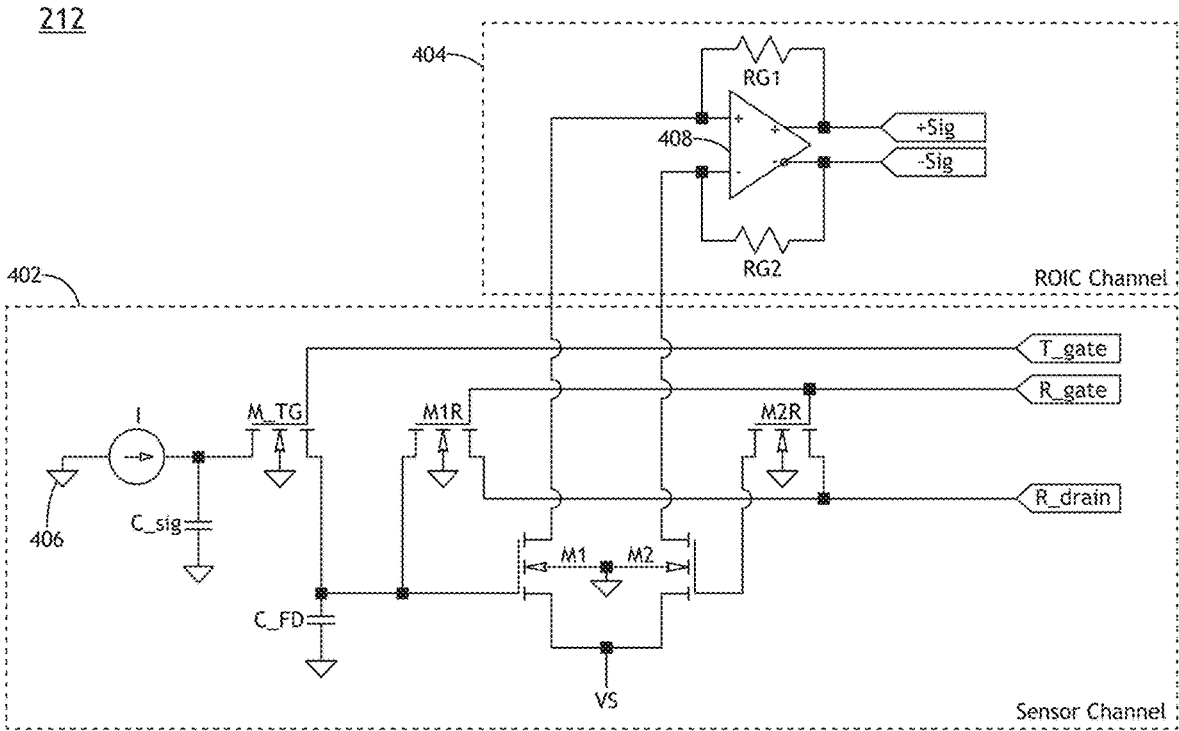
FIG. 4 depicts a circuit element of the X-ray detector, in accordance with one or more embodiments of the present disclosure.

FIG. 4 depicts the circuit elements 212, in accordance with one or more embodiments of the present disclosure. The circuit elements 212 may include one or more channels. For example, the circuit elements 212 may include a sensor channel 402 and/or a read-out integrated circuit channel 404 (ROIC channel). The circuit elements 212 may include one or more of a signal ground 406, a current source (I), a signal capacitor (C_Sig), a transfer gate transistor (M_TG), a floating diffusion capacitor (C_FD), a reset transistor (M1R), a voltage source (VS), a gain transistor (M1), a gain transistor (M2), a reset transistor (M2R), a transfer gate pickup (T_gate), a reset control signal (R_gate), a reset voltage (R_drain), a resistive gate (RG1), a resistive gate (RG2), an amplifier 408, an output signal (+Sig), and/or an output signal (−Sig).

The reset transistor (M1R) may also be referred to as a first reset transistor. The reset transistor (M2R) may also be referred to as a second reset transistor. The gain transistor (M1) may also be referred to as a first gain transistor. The gain transistor (M2) may also be referred to as a second gain. The resistive gate (RG1) may also be referred to as a first resistive gate. The resistive gate (RG2) may also be referred to as a second resistive gate. The output signal (+Sig) may also be referred to as a first output signal. The output signal (−Sig) may also be referred to as a second output signal.

The sensor channel 402 may include the current source (I), the signal capacitor (C_Sig), the transfer gate transistor (M_TG), the floating diffusion capacitor (C_FD), the reset transistor (M1R), the voltage source (VS), the gain transistor (M1), the gain transistor (M2), the reset transistor (M2R), the transfer gate pickup (T_gate), the reset control signal (R_gate), and/or the reset voltage (R_drain).

The read-out integrated circuit channel 404 may include the resistive gate (RG1), the resistive gate (RG2), the amplifier 408, the output signal (+Sig), and/or the output signal (−Sig).

The current source (I) may provide a source of current for the sensor channel 402. An output of the current source (I), a first side of the signal capacitor (C_Sig), and a drain of the transfer gate transistor (M_TG) may connect in parallel.

The signal capacitor (C_Sig) may collect charges from the current source (I) and/or the drain of the transfer gate transistor (M_TG). A second side of the signal capacitor (C_Sig) may connect to signal ground 406.

A gate of the transfer gate transistor (M_TG) and the transfer gate pickup (T_gate) may be connected. The transfer gate pickup (T_gate) may control the flow of charges through the transfer gate pickup (T_gate).

A source of the transfer gate transistor (M_TG), a first side of the floating diffusion capacitor (C_FD), a drain of the reset transistor (M1R), and/or a gate of the gain transistor (M1) may be connected in parallel.

The floating diffusion capacitor (C_FD) may collect charge carriers that are generated within the pixels 217 (e.g., within the buried channel layer 216). For example, the signal capacitor (C_Sig) may collect charge carriers from the drain of the reset transistor (M1R). A second side of the floating diffusion capacitor (C_FD) may be connected to the signal ground 406.

A gate of the reset transistor (M1R), a gate of the reset transistor (M1R), and the reset control signal (R_gate) may be connected in parallel. The reset control signal (R_gate) may control the flow of charge carriers through the reset transistor (M1R) and/or the reset transistor (M1R). The reset control signal (R_gate) may provide a global signal which is common to each of the pixels 217.

A source of the reset transistor (M1R), a source of the reset transistor (M2R), and the reset voltage (R_drain) may be connected in parallel. The reset voltage (R_drain) may provide a source of charge carriers for the reset transistor (M1R) and/or the reset transistor (M1R). The reset voltage (R_drain) may also provide a global signal which is common to each of the pixels 217.

The reset transistor (M1R) and/or the reset transistor (M2R) may reset a voltage of the floating diffusion capacitor (C_FD). For example, the reset transistor (M1R) and/or the reset transistor (M2R) may reset a voltage of the floating diffusion capacitor (C_FD) after a readout operation. The reset transistor (M1R) and/or the reset transistor (M2R) may reset the voltage using the reset voltage (R_drain) in response to the reset control signal (R_gate). In this state, fluctuations in the common ground reference will not impact the difference between the drain currents of the gain transistor (M1) and the gain transistor (M1) measured at the amplifier 408.

A source of the gain transistor (M1), a source of the gain transistor (M2), and/or the voltage source (VS) may be connected in parallel. The voltage source (VS) may provide a source of charge carriers for the gain transistor (M1) and/or the gain transistor (M2).

A gate of the gain transistor (M2) and the drain of the reset transistor (M2R) may be connected. The reset transistor (M2R) may control the flow of charge carriers through the gain transistor (M2).

A drain of the gain transistor (M1), an input (+) of the amplifier 408, and/or a first side of the resistive gate (RG1) may be connected. The amplifier 408 may generate the output signal (+Sig) based on the input (+). The resistive gate (RG1) may provide the output signal (+Sig) as feedback to the input (+) of the amplifier 408.

A drain of the gain transistor (M2), an input (−) of the amplifier 408, and/or a first side of the resistive gate (RG2) may be connected in parallel. The amplifier 408 may generate the output signal (−Sig) based on the input (−). The resistive gate (RG2) may provide the output signal (−Sig) as feedback to the input (−) of the amplifier 408.

The signal capacitor (C_Sig) and/or the floating diffusion capacitor (C_FD) may be formed by an n+ dopant diffused into the buried channel layer 216.

The transfer gate transistor (M_TG), the reset transistor (M1R), the gain transistor (M1), the gain transistor (M2), and/or the reset transistor (M2R) may be N-channel transistors. For example, the transfer gate transistor (M_TG), the reset transistor (M1R), the gain transistor (M1), the gain transistor (M2), and/or the reset transistor (M2R) may be N-channel metal-oxide-semiconductor (NMOS) transistors.

The resistive gate (RG1) and/or the resistive gate (RG2) may be the polycrystalline silicon resistive gate 218.

The circuit elements 212 may provide a readout method using the polycrystalline silicon resistive gate 218. The polycrystalline silicon resistive gate 218 may be a highly-doped low-resistivity polycrystalline silicon gate. The circuit elements 212 may be configured to operate in a differential mode and/or a current mode. The differential readout in current mode may reduce feedthrough noise and power usage.

The circuit elements 212 may provide the differential mode for reading out the output signals from the pixels 217. The difference between the output signal (+Sig) and the output signal (−Sig) may be based on the charge collected in the floating diffusion capacitor (C_FD) and/or the X-ray photons received by the X-ray detector 122. The circuit elements 212 may determine the difference between the output signal (+Sig) and the output signal (−Sig) and/or convert the difference to the X-ray image data signal ID.

The circuit elements 212 may provide several advantages over circuit elements which do not include the differential mode. For example, the differential mode may provide common mode noise immunity from fluctuations in the reset control signal (R_gate). The output signal (+Sig) and the output signal (−Sig) may each change the same amount based on the fluctuations, thereby removing the fluctuations when the difference is determined. The circuit elements 212 may also reduce an offset mismatch between the pixels 217. The circuit elements 212 may allow for low-power and high bandwidth operation to collect the image data signal from the pixel 217 with good noise immunity. The noise immunity may allow scaling the pixels 217 into one- and two-dimensional array formats.

The circuit elements 212 may also provide the current mode. The current mode may allow for high-bandwidth with reduced area and power requirements from the gain transistor (M1) and the gain transistor (M2). The current mode may mitigate the power penalty for differential mode operation. Use of current mode operation may also provide enhanced signal range without the severe saturation that might occur in a low-voltage semiconductor process. The large signals can be handled separately by the read-out integrated circuit channel 404 that may use a process technology optimized for low-noise signal processing.

FIG. 5 depicts a flow diagram of a method 500, in accordance with one or more embodiments of the present disclosure. The method 500 is a method of forming the polycrystalline silicon resistive gates 218. The method 500 may provide a controllable and repeatable process by which the resistivity of the polycrystalline silicon resistive gates 218 may be controlled. The embodiments and enabling technologies described previously herein in the context of the polycrystalline silicon resistive gates 218 should be interpreted to extend to method 500. It is further noted, however, that the method is not limited to the architecture of the polycrystalline silicon resistive gates 218.

In a step 510, a polycrystalline silicon film may be deposited. For example, the polycrystalline silicon film may be deposited on the gate oxide layer 208. The polycrystalline silicon film may be deposited using any suitable process, such as, but not limited to, chemical vapor deposition.

In a step 520, the polycrystalline silicon film is heavily doped with atoms. The atoms may be an N-type impurity (e.g., donor atoms) or a P-type impurity (e.g., acceptor atoms). For example, the polycrystalline silicon film may be heavily doped with phosphorous when N-type polysilicon is desired or boron when a P-type polysilicon is desired. The polycrystalline silicon film may be heavily doped with the atoms to form heavily doped polycrystalline silicon. The polycrystalline silicon film may be heavily doped with the atoms to provide charge carriers well in excess to those necessary to fill the traps.

In a step 530, the heavily doped polycrystalline silicon is ion-implanted with an electrically inactive species to form multiple ion-implanted regions with different resistivities. For example, the heavily doped polycrystalline silicon is ion-implanted with an electrically inactive species to form the ion-implanted region 302 and/or ion-implanted region 304. The electrically inactive species may include nitrogen and carbon.

The heavily doped polycrystalline silicon may be ion-implanted with the electrically inactive species to form the ion-implanted regions using a beamline scan ion implantation technique or a plasma immersion ion implantation (Pill) technique. The beamline scan ion implantation technique may be used to reduce levels of unwanted species implantation into the polysilicon. The plasma immersion ion implantation may immerse the heavily doped polycrystalline silicon in a plasma containing the electrically inactive species. High voltage microsecond negative pulses may be applied to the heavily doped polycrystalline silicon. The pulses may accelerate and implant the plasma ions into the heavily doped polycrystalline silicon. An off time follows each implant pulse. The off time may allow the plasma electrons to neutralize the deposited positive charge.

Complex field patterns of the ion-implanted regions may be achieved via implant writing. The plasma immersion ion implantation may include a multi-step (2 or more) to form multiple of the ion-implanted regions. The plasma immersion ion implantation may also control a gain of the ion-implanted regions for achieving specific resistivity within the ion-implanted regions. The ion-implanting with the electrically inactive species may include one or more sub-steps by which the ion-implanted regions are formed.

In a sub-step 532, a selected region of the polycrystalline silicon resistive gates may be masked. For example, the selected region may be masked on the polycrystalline silicon film. The mask may be deposited by any suitable process, such as, but not limited to photolithography, etching, or the like. The selected region may be regions which are masked and not currently to be ion-implanted. The mask may prevent the masked region from being ion-implanted when the unmasked region is ion-implanted. For example, the ion-implanted region 304 may be the masked region where the ion-implanted region 302 is the unmasked region to be ion-implanted. By way of another example, the ion-implanted region 302 may be the masked region where the ion-implanted region 304 is the unmasked region to be ion-implanted.

In a sub-step 534, the unmasked region of the polycrystalline silicon resistive gates may be ion-implanted with the electrically inactive species. For example, the ion-implanted region 302 may be the unmasked region and may be ion-implanted with a first concentration of the electrically inactive species when the ion-implanted region 304 is masked. By way of another example, the ion-implanted region 304 may the unmasked region and may be ion-implanted with a second concentration of the electrically inactive species when the ion-implanted region 302 is masked. The concentrations of the electrically inactive species at which the ion-implanted region 302 and the ion-implanted region 304 are ion-implanted may be different by the masking preventing the masked region from being ion-implanted.

In a sub-step 536, the selected region may be unmasked. The selected region may be unmasked via any suitable process, such as, but not limited to, etching. The selected region may be unmasked to unmask the polycrystalline silicon resistive film. For example, the ion-implanted region 302 and/or the ion-implanted region 304 may be unmasked.

The polycrystalline silicon film may be masked, ion-implanted, and unmasked to ion-implant each of the regions with the select concentration. Multiple separate regions of the higher- or lower-resistivity regions may be patterned onto a single of the polycrystalline silicon film by masking selected regions, the ion-implantation may be applied, and then the mask layer may be removed. Additional deposition steps may also be employed, to achieve finer control of lateral fields and charge transport within a two-dimensional region of the polycrystalline silicon film. For example, the polycrystalline silicon resistive gates 218 may be a multi-resistivity resistive gate, with three or more ion-implanted regions each with different resistivities which control the lateral fields.

The implantation may accurately and reproducibly control the resistivities within the ion-implanted regions using the electrically inactive species. Controlling the concentration of the electrically inactive species may provide reproducible and controllable resistivity values in the range of 1-10 k ohm-cm for the ion-implanted regions of the polycrystalline silicon film.

In a step 540, the heavily doped polycrystalline silicon may be annealed after the implantation to form a polycrystalline silicon resistive gate. For example, the heavily doped polycrystalline silicon may be annealed to form the polycrystalline silicon resistive gate 218. The annealing may cause the impurity (e.g., the donor atoms, the acceptor atoms) to form small and stable precipitates which will lower the mobility of charge carriers and increase resistivity.

The heavily doped polycrystalline silicon may be annealed at a select temperature, such as, but not limited to, 1000° C. The annealing may activate the dopant after ion-implantation and form an inter-layer dielectric (e.g., the gate oxide layer 208 and/or the silicon nitride gate layer 210).

The heavily doped polycrystalline silicon may be annealed in an O2 atmosphere to form the gate oxide layer 208. The gate oxide layer 208 may be formed over the ion-implanted regions to seal the ion-implanted regions. The duration of annealing in the O2 atmosphere may control the thickness of the gate oxide layer 208. A thicker layer of the gate oxide layer 208 may provide better isolation due to high operation voltage between polysilicon layers. The heavily doped polycrystalline silicon may be annealed in O2 at the select temperature for a select duration, such as, but not limited to, 2 minutes.

The heavily doped polycrystalline silicon may be annealed in an N2 atmosphere to form the silicon nitride gate layer 210. The remainder of the annealing may be carried out in the N2 atmosphere.

It is further contemplated that each of the embodiments of the method described above may include any other step(s) of any other method(s) described herein. In addition, each of the embodiments of the method described above may be performed by any of the systems described herein.

In embodiments, a controller may include one or more controllers housed in a common housing or within multiple housings. In this way, any controller or combination of controllers may be separately packaged as a module suitable for integration into a system. Further, the controllers may analyze data received from detectors and feed the data to additional components within the system or external to the system. The controller may also include one or more processors and/or a memory medium.

The one or more processors may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors may include any device configured to execute algorithms and/or instructions (e.g., program instructions stored in memory). In one embodiment, the one or more processors may be embodied as a desktop computer, mainframe computer system, workstation, image computer, parallel processor, networked computer, or any other computer system configured to execute a program. Moreover, different subsystems of the system may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers.

The memory medium may include any storage medium known in the art suitable for storing program instructions executable by the associated one or more processors. For example, the memory medium may include a non-transitory memory medium. By way of another example, the memory medium may include, but is not limited to, a read-only memory (ROM), a random-access memory (RAM), a magnetic or optical memory device (e.g., disk), a magnetic tape, a solid-state drive and the like. The memory medium may include flash memory cells, or other type memory, discrete EPROM or EEPROM, or the like. It is further noted that memory medium may be housed in a common controller housing with the one or more processors. In one embodiment, the memory medium may be located remotely with respect to the physical location of the one or more processors and controller. For instance, the one or more processors of controller may access a remote memory (e.g., server), accessible through a network (e.g., internet, intranet and the like).

As used throughout the present disclosure, the term "substrate" generally refers to a substrate formed of a semiconductor or non-semiconductor material (e.g., thin filmed glass, or the like). For example, a semiconductor or non-semiconductor material may include, but is not limited to, monocrystalline silicon, gallium arsenide, indium phosphide, or a glass material. A substrate may include one or more layers. For example, such layers may include, but are not limited to, a resist (including a photoresist), a dielectric material, a conductive material, and a semiconductive material. Many different types of such layers are known in the art, and the term sample as used herein is intended to encompass a substrate on which all types of such layers may be formed. One or more layers formed on a substrate may be patterned or un-patterned. For example, a substrate may include a plurality of dies, each having repeatable patterned features. Formation and processing of such layers of material may ultimately result in completed devices. Many different types of devices may be formed on a substrate, and the term substrate as used herein is intended to encompass a substrate on which any type of device known in the art is being fabricated. Further, for the purposes of the present disclosure, the term substrate and wafer should be interpreted as interchangeable. In addition, for the purposes of the present disclosure, the terms patterning device, mask, and reticle should be interpreted as interchangeable.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mixable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A polycrystalline silicon resistive gate comprising:
heavily doped polycrystalline silicon, wherein the heavily doped polycrystalline silicon is one of an n-type semiconductor or a p-type semiconductor, wherein the heavily doped polycrystalline silicon is heavily doped with a plurality of atoms, wherein the plurality of atoms comprise one of donor atoms or acceptor atoms, wherein the plurality of atoms saturate a plurality of carrier traps of the heavily doped polycrystalline silicon;
wherein the heavily doped polycrystalline silicon is additionally ion-implanted with an electrically inactive species, wherein the electrically inactive species comprises one of carbon or nitrogen, wherein the electrically inactive species define a first ion-implanted region and a second ion-implanted region, wherein the first ion-implanted region is implanted with a higher concentration of the electrically inactive species than the second ion-implanted region, wherein a first resistivity of the first ion-implanted region is higher than a second resistivity of the second ion-implanted region.

2. The polycrystalline silicon resistive gate of claim 1, wherein the polycrystalline silicon resistive gate is a thin film, wherein a thickness of the polycrystalline silicon resistive gate is between 50 and 1000 nm.

3. The polycrystalline silicon resistive gate of claim 1, wherein a width and a length of the polycrystalline silicon resistive gate is between 100 and 1000 μm.

4. The polycrystalline silicon resistive gate of claim 1, wherein a concentration of the plurality of atoms is between 30 and 200 times an amount necessary to saturate the plurality of carrier traps of the heavily doped polycrystalline silicon.

5. The polycrystalline silicon resistive gate of claim 1, wherein the first resistivity of the first ion-implanted region is between four and ten times larger than the second resistivity of the second ion-implanted region.

6. The polycrystalline silicon resistive gate of claim 1, wherein the polycrystalline silicon resistive gate is a dual-resistivity resistive gate.

7. The polycrystalline silicon resistive gate of claim 1, wherein the polycrystalline silicon resistive gate is a multi-resistivity resistive gate, wherein the polycrystalline silicon resistive gate comprises three or more ion-implanted regions with different resistivities.

8. The polycrystalline silicon resistive gate of claim 1, wherein the second ion-implanted region is not continuous, wherein at least one portion of the second ion-implanted region are separated from at least one additional portion of the second ion-implanted region by the first ion-implanted region.

9. The polycrystalline silicon resistive gate of claim 1, wherein the second ion-implanted region is a diagonal-striped ion-implanted region, wherein the diagonal-striped ion-implanted region comprises a first pair of diagonal stripes and a second pair of diagonal stripes, wherein the first pair of diagonal stripes are colinear, wherein the second pair of diagonal stripes are colinear, wherein the second pair of diagonal stripes are orthogonal to the first pair of diagonal stripes.

10. The polycrystalline silicon resistive gate of claim 9, wherein the first pair of diagonal stripes and the second pair of diagonal stripes are aligned to a center of the polycrystalline silicon resistive gate.

11. The polycrystalline silicon resistive gate of claim 10, wherein the first pair of diagonal stripes and the second pair of diagonal stripes are aligned to corners of the polycrystalline silicon resistive gate.

12. The polycrystalline silicon resistive gate of claim 10, wherein the first pair of diagonal stripes and the second pair of diagonal stripes do not intersect at the center, wherein the first ion-implanted region is disposed between the first pair of diagonal stripes and the second pair of diagonal stripes.

13. The polycrystalline silicon resistive gate of claim 9, wherein a width of the first pair of diagonal stripes and the second pair of diagonal stripes does not change along a length of the first pair of diagonal stripes and the second pair of diagonal stripes.

14. The polycrystalline silicon resistive gate of claim 1, wherein the second ion-implanted region is a polygonal-shaped ion-implanted region, wherein the polygonal-shaped ion-implanted region is centered on the polycrystalline silicon resistive gate.

15. The polycrystalline silicon resistive gate of claim 14, wherein the polygonal-shaped ion-implanted region includes a reflective symmetry about four axes which are each offset by 45° and are orthogonal to a center axis, wherein the polygonal-shaped ion-implanted region includes a rotational symmetry of 90°.

16. The polycrystalline silicon resistive gate of claim 15, wherein the polygonal-shaped ion-implanted region is an octagon.

17. An X-ray detector comprising:
a gate oxide layer; and
a plurality of polycrystalline silicon resistive gates, wherein the plurality of polycrystalline silicon resistive gates are formed in the gate oxide layer, wherein the plurality of polycrystalline silicon resistive gates comprise:
heavily doped polycrystalline silicon, wherein the heavily doped polycrystalline silicon is one of an n-type semiconductor or a p-type semiconductor, wherein the heavily doped polycrystalline silicon is heavily doped with a plurality of atoms, wherein the plurality of atoms comprise one of donor atoms or acceptor atoms, wherein the plurality of atoms saturate a plurality of carrier traps of the heavily doped polycrystalline silicon;

wherein the heavily doped polycrystalline silicon is ion-implanted with an electrically inactive species, wherein the electrically inactive species comprises one of carbon or nitrogen, wherein the electrically inactive species define a first ion-implanted region and a second ion-implanted region, wherein the first ion-implanted region is implanted with a higher concentration of the electrically inactive species than the second ion-implanted region, wherein a first resistivity of the first ion-implanted region is higher than a second resistivity of the second ion-implanted region;
wherein the X-ray detector is configured to generate an image data signal in response to detecting at least one X-ray photon.

18. The X-ray detector of claim 17, comprising a plurality of electrical connections, wherein the plurality of electrical connections are made to the plurality of polycrystalline silicon resistive gates, wherein the plurality of electrical connections comprise a plurality of source electrical connections and a plurality of drain electrical connections, wherein the plurality of source electrical connections are made around a perimeter of the plurality of polycrystalline silicon resistive gates, wherein the plurality of drain electrical connections are made to a center of the plurality of polycrystalline silicon resistive gates.

19. The X-ray detector of claim 17, comprising:
a substrate, wherein the gate oxide layer is formed on a top side surface of the substrate;
a boron layer, wherein the boron layer formed on a back side of the substrate;
an epitaxial layer, wherein the epitaxial layer is formed on a front side surface of the substrate, wherein the epitaxial layer is a p-type semiconductor; and
a buried channel layer, wherein the buried channel layer is formed in the epitaxial layer, wherein the buried channel layer is an n-type semiconductor.

20. The X-ray detector of claim 17, comprising a plurality of circuit elements, wherein the plurality of circuit elements are configured to operate in a differential mode and a current mode.

21. The X-ray detector of claim 20, wherein the plurality of circuit elements comprise a current source, a signal capacitor, a transfer gate transistor, a floating diffusion capacitor, a first reset transistor, a voltage source, a first gain transistor, a second gain transistor, a second reset transistor, a transfer gate pickup, a reset control signal, a reset voltage, a first resistive gate, a second resistive gate, and an amplifier;
wherein the amplifier is configured to output a first output signal and a second output signal, wherein the plurality of circuit elements are configured to determine a difference between the first output signal and the second output signal and convert the difference to the image data signal;
wherein the plurality of polycrystalline silicon resistive gates comprise the first resistive gate and the second resistive gate, wherein the first resistive gate and the second resistive gate provide the first output signal and the second output signal as feedback to inputs of the amplifier.

22. A scanning electron microscope comprising:
an electron source configured to generate an electron beam;
an electron optical system configured to focus the electron beam and scan the electron beam over a sample; and
at least one X-ray detector comprising:
a gate oxide layer; and a plurality of polycrystalline silicon resistive gates, wherein the plurality of polycrystalline silicon resistive gates are formed in the gate oxide layer, wherein the plurality of polycrystalline silicon resistive gates comprise:

heavily doped polycrystalline silicon, wherein the heavily doped polycrystalline silicon is one of an n-type semiconductor or a p-type semiconductor, wherein the heavily doped polycrystalline silicon is heavily doped with a plurality of atoms, wherein the plurality of atoms comprise one of donor atoms or acceptor atoms, wherein the plurality of atoms saturate a plurality of carrier traps of the heavily doped polycrystalline silicon;

wherein the heavily doped polycrystalline silicon is ion-implanted with an electrically inactive species, wherein the electrically inactive species comprises one of carbon or nitrogen, wherein the electrically inactive species define a first ion-implanted region and a second ion-implanted region, wherein the first ion-implanted region is implanted with a higher concentration of the electrically inactive species than the second ion-implanted region, wherein a first resistivity of the first ion-implanted region is higher than a second resistivity of the second ion-implanted region;

wherein the at least one X-ray detector is configured to generate an image data signal in response to detecting at least one X-ray photon generated from the sample resulting from exposure to the electron beam.

23. A method comprising:

depositing a polycrystalline silicon film on a gate oxide layer;

heavily doping the polycrystalline silicon film with a plurality of atoms to form a heavily doped polycrystalline silicon, wherein the heavily doped polycrystalline silicon is one of an n-type semiconductor or a p-type semiconductor, wherein the plurality of atoms comprise one of donor atoms or acceptor atoms, wherein the plurality of atoms saturate a plurality of carrier traps of the heavily doped polycrystalline silicon;

ion-implanting the heavily doped polycrystalline silicon with an electrically inactive species, wherein the electrically inactive species comprises one of carbon or nitrogen; and annealing the heavily doped polycrystalline silicon after ion-implantation to form a polycrystalline silicon resistive gate, wherein the electrically inactive species define a first ion-implanted region and a second ion-implanted region, wherein the first ion-implanted region is implanted with a higher concentration of the electrically inactive species than the second ion-implanted region, wherein a first resistivity of the first ion-implanted region is higher than a second resistivity of the second ion-implanted region.

* * * * *